(12) United States Patent
Nakamura et al.

(10) Patent No.: US 7,405,953 B2
(45) Date of Patent: Jul. 29, 2008

(54) DRIVING CIRCUIT FOR POWER SWITCHING DEVICE

(76) Inventors: Kimikazu Nakamura, c/o Denso Corporation, 1-1, Showa-cho, Kariya-city, Aichi-pref. (JP) 448-8661; Tsuyoshi Yamashita, c/o Denso Corporation, 1-1, Showa-cho, Kariya-city, Aichi-pref. (JP) 448-8661; Tsuyoshi Hosoda, c/o Denso Corporation, 1-1, Showa-cho, Kariya-city, Aichi-pref. (JP) 448-8661; Yuji Hayashi, c/o Nippon Soken, Inc., 14, Iwaya, Shimohasumi-cho, Nishio-city, Aichi-pref. (JP) 445-0012

( * ) Notice: Subject to any disclaimer, the term of this patent is extended or adjusted under 35 U.S.C. 154(b) by 0 days.

(21) Appl. No.: 11/708,672

(22) Filed: Feb. 21, 2007

(65) Prior Publication Data
US 2007/0195556 A1    Aug. 23, 2007

(30) Foreign Application Priority Data
Feb. 21, 2006    (JP)    ............................. 2006-043597

(51) Int. Cl.
*H02M 3/335*    (2006.01)
(52) U.S. Cl. ............... 363/21.12; 363/21.14; 363/56.03
(58) Field of Classification Search ............. 363/21.12, 363/21.14, 21.16, 21.17, 21.18, 56.03, 56.05

See application file for complete search history.

(56) References Cited

U.S. PATENT DOCUMENTS

| 6,011,703 | A  | * | 1/2000  | Boylan et al. ............ 363/21.06 |
| 6,049,471 | A  | * | 4/2000  | Korcharz et al. ............... 363/20 |
| 6,075,352 | A  | * | 6/2000  | Kates et al. .................. 323/283 |
| 6,342,737 | B1 | * | 1/2002  | Brodeur ....................... 307/87 |
| 6,597,587 | B1 | * | 7/2003  | Poon et al. ............... 363/21.06 |
| 6,671,189 | B2 | * | 12/2003 | Jansen et al. ............. 363/21.14 |
| 6,788,553 | B1 | * | 9/2004  | Jin et al. .................. 363/21.06 |
| 6,859,373 | B1 | * | 2/2005  | Jin et al. .................. 363/21.06 |
| 6,961,256 | B2 | * | 11/2005 | Yang .......................... 363/127 |

FOREIGN PATENT DOCUMENTS

JP    2005-151700    6/2005

* cited by examiner

*Primary Examiner*—Bao Q Vu

(57) ABSTRACT

A driving circuit has a p-channel transistor and an n-channel transistor. A power switching element is set at an on state each time the p-channel transistor sets a charging line at a conductive state in response to a leading edge of an output pulse to supply a positive charge to a gate of the element through the charging line. The element is set at an off state each time the n-channel transistor sets a discharging line at a conductive state in response to a trailing edge of the output pulse to discharge the supplied charge through the discharging line. A through current occasionally flows through the transistors set at the on state together. The driving circuit has resistors between the transistors to suppress the through current.

15 Claims, 7 Drawing Sheets

DRIVING CIRCUIT FOR POWER SWITCHING DEVICE

CROSS-REFERENCE TO RELATED APPLICATION

This application is based upon and claims the benefit of priority of the prior Japanese Patent Application 2006-043597 filed on Feb. 21, 2006 so that the contents of which are incorporated herein by reference.

BACKGROUND OF THE INVENTION

1. Field of the Invention

The present invention relates generally to a driving circuit which drives and controls a voltage control type power switching element so as to perform a switching operation in the power switching element by applying a voltage to a gate of the power switching element while controlling the voltage in response to an output pulse, and more particularly to a driving circuit having a first switching element, which sets a charging line at a conductive state to supply a positive or negative electric charge to the gate of the power switching element through the charging line in response to each first edge of the output pulse such as leading edge or trailing edge, and a second switching element, which sets a discharging line at a conductive state to discharge the supplied charge from the gate of the power switching element through the discharging line in response to each second edge of the output pulse.

2. Description of Related Art

Published Japanese Patent First Publication No. 2005-151700 discloses a driving circuit for a main switching element. In this circuit, the main switching element is driven in synchronization with each edge of an output pulse of a transformer. More specifically, a p-channel transistor of the driving circuit is turned on in synchronization with each leading edge of the output pulse to supply a positive electric charge to a gate of the switching element through the p-channel transistor, and an n-channel transistor of the driving circuit is turned on in synchronization with each trailing edge of the output pulse to discharge the supplied charge from the gate of the switching element through the n-channel transistor. Therefore, a positive voltage and a negative voltage can alternately be applied to the gate of the switching element, so that the driving circuit can drive the switching element so as to perform a switching operation in the switching element.

However, both of the p-channel and n-channel transistors are inevitably turned on together during an overlap period of time. Therefore, a large amount of current passes through the p-channel and n-channel transistors as a through current, so that reliability of the driving circuit is lowered.

Further, an other driving circuit has been proposed. This circuit has a first switching element, which sets a charging line at a conductive state in response to each leading edge of an output pulse generated in a transformer to supply a positive electric charge to a gate of a power switching element through the charging line, and a second switching element which sets a discharging line at a conductive state in response to each trailing edge of the output pulse to discharge the supplied charge from the gate of the power switching element. In this circuit, a through current flows through the conducting elements during an overlap period of time, in the same manner. Therefore, reliability of the driving circuit is also lowered.

SUMMARY OF THE INVENTION

An object of the present invention is to provide, with due consideration to the drawbacks of the conventional driving circuit for a power switching element, a driving circuit which drives a power switching element with high reliability to perform a switching operation in the power switching element when two conducting elements alternately set a charging line and a discharging line at a conductive state to alternately supply and discharge a positive or negative charge to/from a conducting control terminal of the power switching element through the charging line or the discharging line.

According to an aspect of this invention, the object is achieved by the provision of a driving circuit having a first switching element, a second switching element and a current suppressing element. The first switching element sets a charging line at a conductive state in response to a first edge of an output pulse to supply an electric charge to a conducting control terminal of a power switching element through the first switching element and the charging line, so that the power switching element is set at one of on and off states. The second switching element sets a discharging line at a conductive state in response to a second edge of the output pulse to discharge the supplied electric charge from the conducting control terminal of the power switching element through the second switching element and the discharging line, so that the power switching element is set at the other state. The current suppressing element suppresses a through current flowing, in response to at least one of the first and second edges of the output pulse, through the first switching element and the second switching element.

With this arrangement, when the first edge of the output pulse denotes a leading edge, the first switching element supplies a positive electric charge to the terminal of the power switching element in response to the leading edge of the output pulse to turn on an n-channel power switching element or to turn off a p-channel power switching element, and the second switching element discharges the supplied charge from the terminal of the power switching element in response to the trailing edge of the output pulse to turn off the n-channel power switching element or to turn on the p-channel power switching element. In contrast, when the first edge of the output pulse denotes a trailing edge, the first switching element supplies a negative electric charge to the terminal of the power switching element in response to the trailing edge of the output pulse to turn on a p-channel power switching element or to turn off an n-channel power switching element, and the second switching element discharges the supplied charge from the terminal of the power switching element in response to the leading edge of the output pulse to turn off the p-channel power switching element or to turn on the n-channel power switching element. Therefore, the driving circuit drives the power switching element so as to alternately set the power switching element at the on and off states.

Further, an apparent gate capacity (i.e. Miller capacity) of each transistor is changed with respect to a gate voltage of the transistor. Therefore, a timing of a turn-off in each transistor is inevitably delayed from a timing of each edge of the output pulse, as compared with a timing of a turn-on in the transistor. As a result, the conducting elements are set at the on state together in response to at least one of the first and second edges of the output pulse, so that a through current undesirably flows through the transistors. However, because the current suppressing element suppresses the through current, heat generated from the through current in the transistors can be reduced. Accordingly, the driving circuit can drive the power switching element with high reliability such that the power switching element performs a switching operation.

DETAILED DESCRIPTION OF THE PREFERRED EMBODIMENTS

Figure 1:
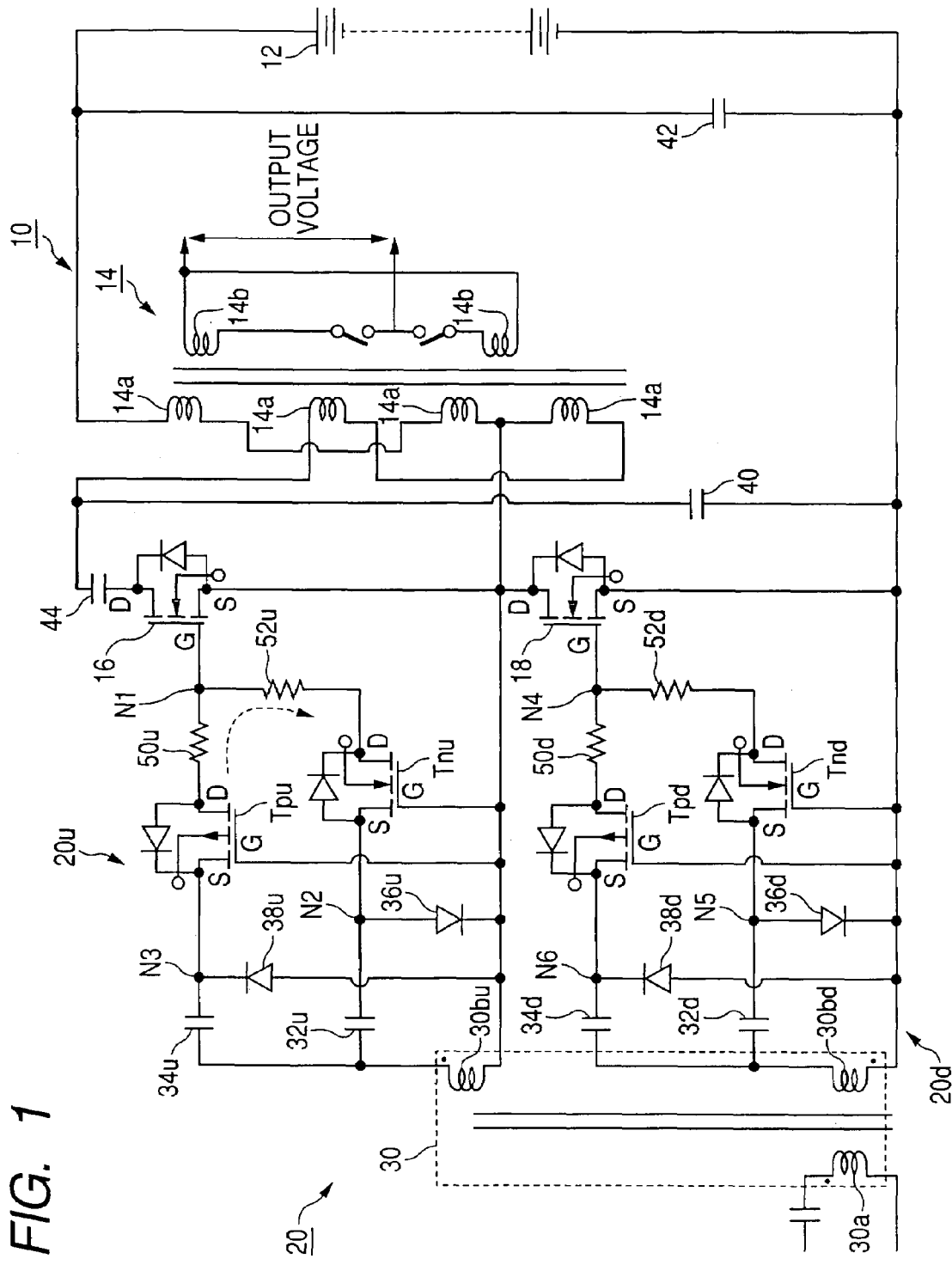
FIG. 1 is a circuit view showing both a DC-DC converter including power switching elements and a driving circuit for the power switching elements according to a first embodiment of the present invention.

Embodiments of the present invention will now be described with reference to the accompanying drawings, in which like reference numerals indicate like parts, members or elements throughout the specification unless otherwise indicated. However, these embodiments should not be construed as limiting the present invention to structures of those embodiments, and the structure of this invention may be combined with that based on the prior art.

Embodiment 1

A driving and control circuit for controlling a switching operation of power switching elements is described with reference to FIG. 1 to FIG. 5 according to the first embodiment of the present invention. FIG. 1 is a circuit view showing both a DC-DC converter including power switching elements and a driving circuit for the power switching elements according to the first embodiment.

As shown in FIG. 1, a DC-DC (direct current to direct current) converter 10 has a high voltage battery 12, a transformer 14 with primary coils 14a and secondary coils 14b, and two power switching elements 16 and 18. The DC-DC converter 10 is, for example, mounted on a hybrid vehicle (not shown). A generator mounted on the vehicle generates an electric power of a high voltage, and the battery 12 accumulates the generated electric power. Each of the power elements 16 and 18 is, for example, formed of an n-channel metal oxide semiconductor (MOS) power transistor. The power elements 16 and 18 are electrically connected with the primary coils 14a of the transformer 14. A driving and control circuit (hereinafter, called driving circuit) 20 drives and controls the power elements 16 and 18, so that the power elements 16 and 18 perform a switching operation. The converter 10 generates an alternating current from the electric power of the battery 12 based on the switching operation of the power elements 16 and 18. A high voltage of the battery 12 is applied to the primary coils 14a. Based on the alternating current, the transformer 14 electromagnetically induces a low voltage in the secondary coils 14b from the high voltage of the primary coils 14a, and outputs the low voltage from the secondary coils 14b.

More specifically, a source of the power element 16 is directly connected with a drain of the power element 18. A drain of the power element 16 is connected with a higher voltage electrode of the battery 12 through a capacitor 44 and the coils 14a. A source of the power element 18 is directly connected with a lower voltage electrode of the battery 12. A capacitor 40 is connected with the capacitor 44 and the source of the power element 18 in parallel to the battery 12. A capacitor 42 is disposed in parallel to the battery 12. The converter 10 generates a primary coil alternating current voltage in each primary coil 14a from a high direct current voltage of the battery 12 in response to the switching operation of the power elements 16 and 18 and converts the primary coil voltage into a secondary coil voltage determined by a turn ratio of secondary coil(s) 14b to the primary coil(s) 14a. The secondary coil voltage is output from the secondary coil 14b as an output voltage.

The driving circuit 20 has a pulse transformer 30 including a primary coil 30a and secondary coils 30bu and 30bd, a first circuit portion 20u electrically connected with both the secondary coil 30bu and the power switching element 16, and a second circuit portion 20d electrically connected with both the secondary coil 30bd and the power switching element 18.

In the transformer 30, the primary coil 30a receives an input pulse from a control unit (not shown), the secondary coil 30bu generates a first output pulse from the input pulse, and the secondary coil 30bd generates a second output pulse from the input pulse. A voltage of the first output pulse is determined by a turn ratio of the secondary coil 30bu to the primary coil 30a. A voltage of the second output pulse is determined by a turn ratio of the secondary coil 30bd to the primary coil 30a. A winding direction of the secondary coil 30bu is set to be opposite to that of the secondary coil 30bd, so that phases of the output pulses are inverted to each other. That is, when the first output pulse is set at a high level, the second output pulse is set at a low level. In contrast, when the first output pulse is low, the second output pulse is high. A symbol "•" shown in FIG. 1 in each secondary coil denotes a start point of the winding of the coil. A first terminal of the secondary coil 30bu is placed at the start point of the winding of the coil 30bu. A second terminal of the secondary coil 30bu is placed at a final point of the winding of the coil 30bu and is directly connected with a source of the power element 16. A first terminal of the secondary coil 30bd is placed at a final point of the winding of the coil 30bd. A second terminal of the secondary coil 30bu is placed at the start point of the winding and is directly connected with a source of the power element 18.

The first portion 20u has a first switching element represented by a p-channel MOS transistor Tpu, a second switching element represented by an n-channel MOS transistor Tnu, and a current suppressing element represented by one of or both of resistors 50u and 52u. The transistor Tpu is inserted in a charging line Lc, and the line Lc is connected with a source and a drain of the transistor Tpu and the gate of the power element 16. The transistor Tnu is inserted in a discharging line Ld, and the line Ld is connected with a source and a drain of the transistor Tnu and the gate of the power element 16. A gate of the transistor Tpu and a gate of the transistor Tnu are connected with the second terminal of the coil 30bu together. The transistor Tpu is turned on in response to each leading edge of the first output pulse of the transformer 30 to set the charging line Lc at a conductive state. Therefore, a positive electric charge is supplied to a gate (i.e., conducting control terminal) of the power element 16 through the charging line Lc, and the power element 16 is set at an on state. The transistor Tnu is turned on in response to each trailing edge of the output pulse to set the discharging line Ld at a conductive state. Therefore, the supplied electric charge is discharged from the gate of the power element 16, and the power element 16 is set at an off state.

The resistor 50u is inserted in the charging line Lc so as to be, for example, connected with the drain of the transistor Tpu and the gate of the power element 16. The resistor 52u is inserted in the discharging line Lc so as to be, for example, connected with the drain of the transistor Tnu and the gate of the power element 16. The charging line Lc and the discharging line Lc are, for example, connected with each other at a first node N1, and the node N1 is placed between the resistors 50u and 52u. As described later in detail, the resistors 50u and 52u suppress a through current flowing, in response to each of the leading and trailing edges of the output pulse, between the transistors Tpu and Tnu set at an on state together.

In the same manner, the second portion 20d supplies a positive electric charge to a gate (i.e., conducting control terminal) of the power switching element 18 in response to each leading edge of the second output pulse to set the power element 18 at an on state, discharges the supplied charge from the gate of the power switching element 18 in response to each trailing edge of the second output pulse to set the power element 18 at an off state, and suppresses a through current flowing in response to each of the leading and trailing edges of the output pulse. Therefore, when the power element 16 is set in an on state, the power element 18 is set in an off state. In contrast, when the power element 16 is set in an off state, the power element 18 is set in an on state.

The first portion 20u may further have a capacitor 32u connected with the source of the transistor Tnu through a second node N2, and a capacitor 34u connected with the source of the transistor Tpu through a third node N3. A first electrode of the capacitor 32u faces the source of the transistor Tnu, and a second electrode of the capacitor 32u is connected with the first terminal of the secondary coil 30bu. A first electrode of the capacitor 34u faces the source of the transistor Tpu, and a second electrode of the capacitor 34u is connected with the first terminal of the secondary coil 30bu. The charging line Lc extends from the capacitor 34u to the gate of the power element 16, and the discharging line Ld extends from the gate of the power element 16 to the capacitor 32u.

The first portion 20u may further have rectifiers such as diodes 36u and 38u. The diode 36u is connected with the node N2 and the second terminal of the coil 30bu so as to allow a current flowing from the node N2 to the second terminal of the coil 30bu and prevent a current from flowing from the second terminal of the coil 30bu to the node N2. The diode 38u is connected with the node N3 and the second terminal of the coil 30bu so as to allow a current flow from the second terminal of the coil 30bu to the node N3 and prevent a current flowing from the node N3 to the second terminal of the coil 30bu.

The second portion 20d has capacitors 32d and 34d, a p-channel transistor Tpd, an n-channel transistor Tnd, resistors 50d and 52u and diodes 36d and 38d, and the arrangement of the second portion 20d is the same as that of the first portion 20u. That is, when a letter "u" used for reference symbols of the constituent elements of the first portion 20u is replaced with a letter "d" in the explanation of the arrangement of the first portion 20u, it would be recognized that the arrangement of the second portion 20d is substantially explained.

Next, a switching operation of the power switching element 16 driven by the first portion 20u of the driving circuit 20 is described. Because a switching operation of the power switching element 18 driven by the second portion 20d is the same as that of the power element 16, the explanation of a switching operation of the power switching element 18 is omitted.

Figure 2:
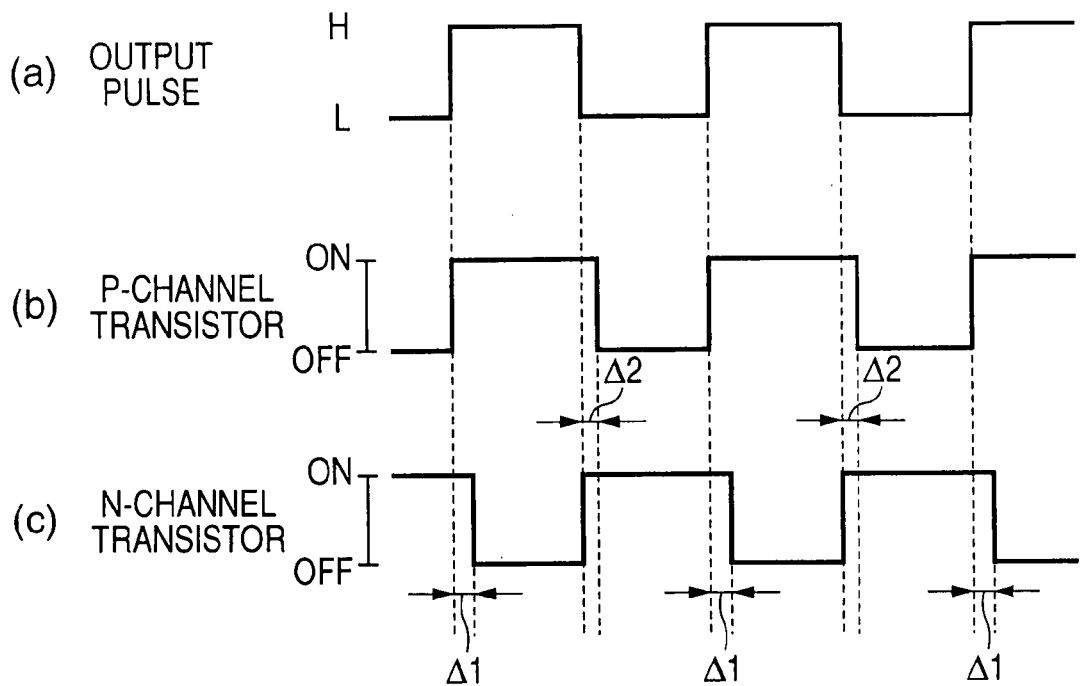
FIG. 2 is a time chart showing a switching operation of transistors of the driving circuit performed in response to an output pulse according to the first embodiment.
Figure 3A:
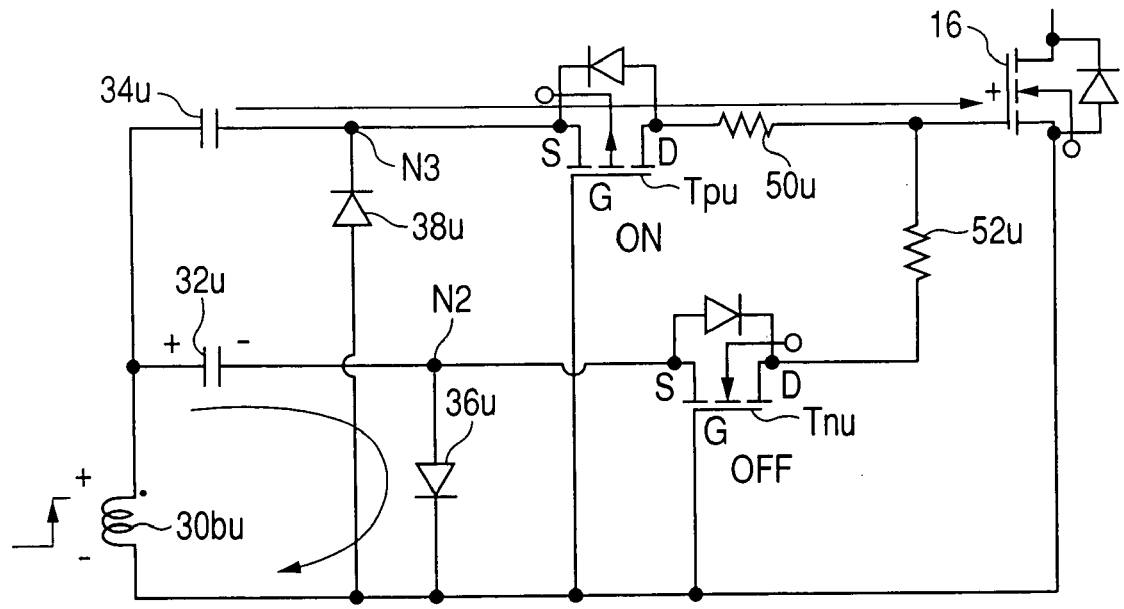
FIG. 3A shows a charging operation for supplying a positive charge to a gate of the power switching element according to the first embodiment.
Figure 3B:
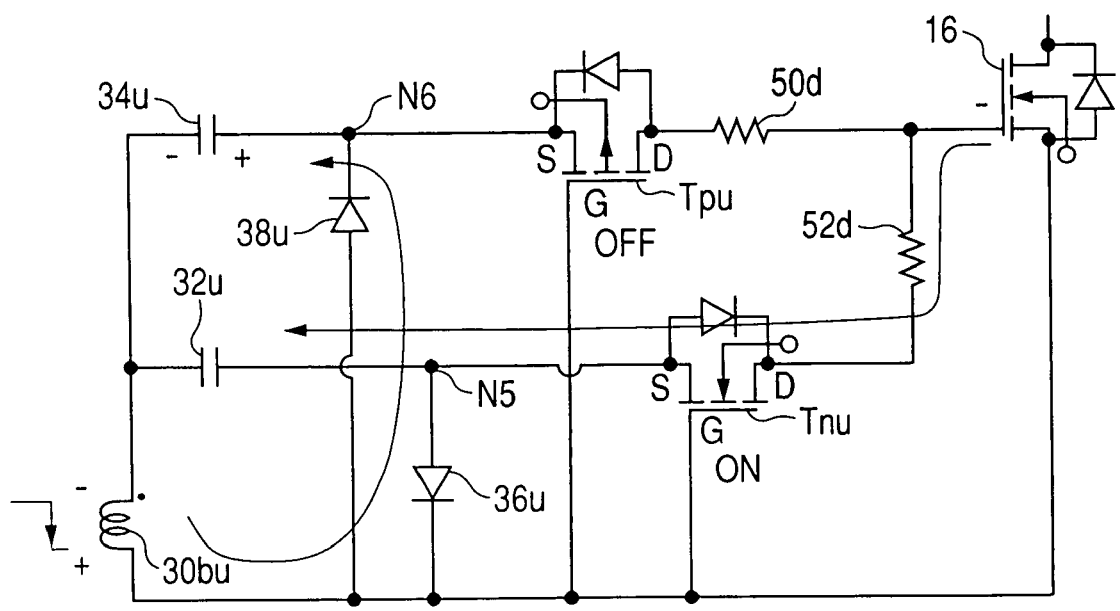
FIG. 3B shows a discharging operation for discharging the positive charge from the gate of the power switching element according to the first embodiment.

FIG. 2 is a time chart showing a switching operation of the transistors Tpu and Tnu performed in response to the first output pulse of the transformer 30. FIG. 3A shows a charging operation for supplying a positive charge to the gate of the power element 16, and FIG. 3B shows a discharging operation for discharging the supplied positive charge from the gate of the power element 16.

When an output pulse generated in the secondary coil 30bu is fallen down to a low level so as to induce a voltage in the coil 30bu, a current of a pulse shape flows from the second terminal of the coil 30bu to the first terminal of the coil 30bu through the diode 38u and the capacitor 34u. Therefore, the first electrode of the capacitor 34u facing the source of the transistor Tpu is charged with a positive electric charge, and the capacitor 34u has an electric potential difference such that an electric potential of the first electrode of the capacitor 34u becomes higher than the second electrode of the capacitor 34u.

As shown in FIG. 3A, when the output pulse is risen up from the low level, an electric potential of the first electrode of the capacitor 34u is heightened so as to heighten an electric potential of the node N3, and an electric potential of the source of the transistor Tpu becomes higher than an electric potential of the gate of the transistor Tpu. Further, a pulse current flows from the first terminal of the coil 30bu to the second terminal of the coil 30bu through the capacitor 32u and the diode 36u, so that an electric potential of the gate of the transistor Tnu becomes lower than an electric potential of the source of the transistor Tnu. Therefore, as shown in FIG. 2, the p-channel transistor Tpu is turned on in response to a leading edge of the output pulse, and the n-channel transistor Tnu is turned off in response to the leading edge of the output pulse.

In this case, as shown in FIG. 3A, a sum of an electric potential of the first terminal of the coil 30bu and the electric potential difference of the capacitor 34u is applied to the gate of the power switching element 16. That is, a positive charge accumulated at the first electrode of the capacitor 34u is supplied to the gate of the power element 16 through the opened transistor Tpu. As a result, a gate electric potential of the power element 16 becomes higher than a source electric potential of the power element 16, so that the power element 16 is set at an on state. The diode 38u acts to maintain the source of the transistor Tpu at an electric potential higher than an electric potential of the gate of the transistor Tpu. Therefore, when the output pulse is set at a high level after the leading edge of the output pulse, the power element 16 reliably continues to be an on state.

Further, as shown in FIG. 3A, the capacitor 32u is charged so as to heighten an electric potential of the second electrode of the capacitor 32u facing the coil 30bu due to the current flowing from the first terminal of the coil 30bu to the second terminal of the coil 30bu through the diode 36u. Therefore, the first electrode of the capacitor 32u facing the source of the transistor Tnu is charged with a negative electric charge from the coil 30bu through the diode 36u. In other words, a positive electric charge held at the first electrode of the capacitor 32u is discharged to the coil 30bu through the diode 36u.

Thereafter, as shown in FIG. 3B, when the output pulse is fallen down from the high level, electric potentials of the electrodes of the capacitor 32u are lowered so as to lower an electric potential of the node N2, and the source electric potential of the transistor Tnu becomes lower than the gate electric potential of the transistor Tnu. Further, a pulse current flows from the second terminal of the coil 30bu to the first terminal of the coil 30bu through the diode 38u and the capacitor 34u, so that the gate electric potential of the transistor Tpu becomes higher than the source electric potential of the transistor Tpu. Therefore, as shown in FIG. 2, the n-channel transistor Tnu is turned on in response to a trailing edge of the output pulse, and the p-channel transistor Tpu is turned off in response to the trailing edge of the output pulse.

In this case, as shown in FIG. 3B, the positive charge supplied to the gate of the power element 16 is discharged to the first electrode of the capacitor 32u through the opened transistor Tnu. As a result, the gate electric potential of the power element 16 becomes lower than the source electric potential of the power element 16, so that the power element 16 is set at an off state. The diode 36u acts to maintain the source of the transistor Tnu at an electric potential lower than an electric potential of the gate of the transistor Tnu. Therefore, when the output pulse is set in a low level after the trailing edge of the output pulse, the power element 16 reliably continues to be an off state.

Further, as shown in FIG. 3B, the capacitor 34u is charged so as to heighten an electric potential of the first electrode of the capacitor 34u due to the current flowing from the second terminal of the coil 30bu to the first terminal of the coil 30bu through the diode 38u. In other words, although the first electrode of the capacitor 34u looses a positive electric charge at the last leading edge of the output pulse, the first electrode of the capacitor 34u is recharged with a positive electric charge.

Therefore, supposing the transistors Tpu and Tnu are simultaneously turned on and off in response to each edge of the output pulse, a positive voltage and a negative voltage can be alternately applied to the gate of the power element 16 in response to the output pulse. Therefore, the power element 16 can stably perform a switching operation. That is, the driving circuit 20 reliably continues to apply a negative voltage to the gate of the power element 16 when the output pulse is set in a low level. Therefore, even when noises undesirably enter the DC-DC converter 10, the driving circuit 20 can prevent the power elements 16 and 18 from being erroneously operated due to the noises.

However, as shown in FIG. 2, the transistors Tpu and Tnu are set in an on state together during an overlap period of time just after each edge of the output pulse. That is, a change to an off state in each of the transistors Tpu and Tnu is inevitably delayed from the corresponding edge of the output pulse, as compared with a change to an on state in the other transistor. More specifically, a timing of the turn-off in the transistor Tnu is delayed by a delay time Δ1 as compared with a timing of the turn-on in the transistor Tpu, and a timing of the turn-off in the transistor Tpu is delayed by a delay time Δ2 as compared with a timing of the turn-on in the transistor Tnu. The reason that the turn-off operation is delayed as compared with the turn-on operation is that an apparent electric capacity of a gate, that is, a Miller capacity is, for example, changed with respect to a gate voltage.

Figure 4:
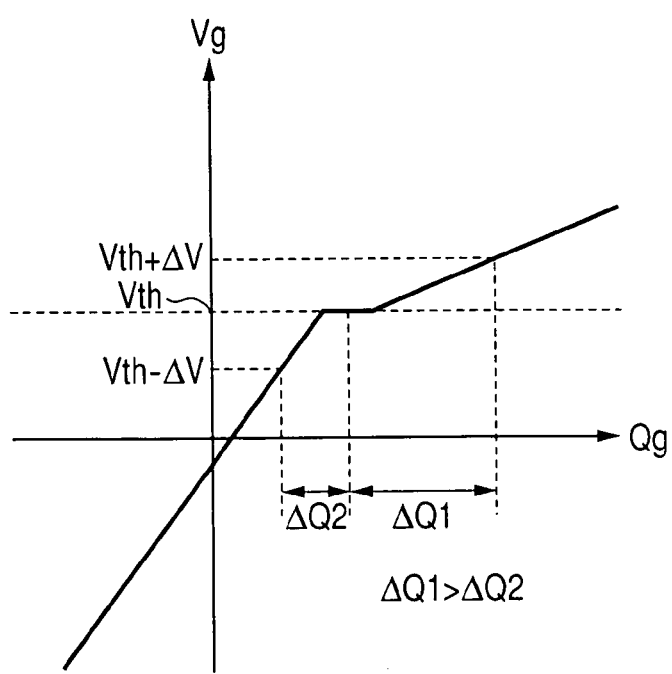
FIG. 4 shows a relation between a voltage and a quantity of electric charge in a gate of an n-channel transistor.

FIG. 4 shows a relation between a voltage Vg and a quantity Qg of electric charge held in the gate of the n-channel transistor Tnu. As shown in FIG. 4, a Miller capacity of the transistor Tnu is indicated by a ratio Qg/Vg of the charge quantity Qg supplied to the gate to the gate voltage Vg. The transistor Tnu is turned on when the gate voltage Vg is increased to a threshold voltage Vth. When the gate voltage Vg is lower than the threshold voltage Vth, the Miller capacity is substantially equal to a first value. When the gate voltage Vg is higher than the threshold voltage Vth, the Miller capacity is substantially equal to a second value higher than the first value. Therefore, the Miller capacity is heightened when the gate voltage Vg exceeds the threshold voltage Vth. In this case, a quantity ΔQ1 of electric charge discharged from the gate to decrease the gate voltage Vg from a value Vth+ΔV (ΔV>0) to the threshold value Vth is larger than a quantity ΔQ2 of electric charge supplied to the gate to increase the gate voltage Vg from a value Vth-ΔV to the threshold value Vth. Therefore, a quantity of electric charge required for a change from the turn-on to the turn-off becomes larger than a quantity of electric charge required for a change from the turn-off to the turn-on. As a result, the turn-off is delayed as compared with the turn-on. Similarly, in case of the p-channel transistor Tpu, a quantity of electric charge required for a change from the turn-on to the turn-off is larger than a quantity of electric charge required for a change from the turn-off to the turn-on, so that the turn-off is delayed as compared with the turn-on.

Therefore, assuming that the drain of the transistor Tpu is directly connected with the drain of the transistor Tnu without placing any current delaying element or current suppressing element between the drain of the transistor Tpu and the drain of the transistor Tnu, a through current undesirably flows from the first terminal of the coil 30bu to the second terminal of the coil 30bu through the capacitor 34u, the opened transistor Tpu, the opened transistor Tnu and the diode 36u during the overlap period Δ1 of time after each leading edge of the output pulse, or a through current undesirably flows from the second terminal of the coil 30bu to the first terminal of the coil 30bu through the diode 38u, the opened transistor Tpu, the opened transistor Tnu and the capacitor 32u during the overlap period Δ2 of time after each trailing edge of the output pulse. Because an amount of charge carried by the through current becomes higher than that charged or discharged to/from the gate of the power element 16, heat generated in the transistors Tpu and Tnu is increased. Therefore, there is a probability that the transistors Tpu and Tnu may malfunction or be broken. Further, a timing of supplying the positive charge to the gate of the power element 16 becomes delayed, or a timing of discharging the positive charge from the gate of the power element 16 becomes delayed. In this case, it is difficult to heighten a switching frequency in the power switching elements 16 and 18 at a high frequency.

To prevent the through current from flowing through the transistors Tpu and Tnu, a resistance value of a wiring connected with the gate of the transistor Tpu shown in FIG. 1 is increased according to the prior art. In this case, a timing of the turn-on in the transistor Tpu can be delayed, so that the transistor Tpu is turned on simultaneously with the turn-off of the transistor Tnu. However, when the output pulse has fallen down, a timing of the turn-off in the transistor Tpu is further delayed as compared with a timing of the turn-on in the transistor Tnu.

In this embodiment, as shown in FIG. 1, to suppress the through current flowing through the transistors Tpu and Tnu, the resistors 50u and 52u serially connected with each other are connected with the drains of the transistors Tpu and Tnu. Similarly, in the second portion 20d, to suppress a through current flowing through the transistors Tpd and Tnd, the resistors 50d and 52d serially connected with each other are connected with the drains of the transistors Tpd and Tnd such that a fourth node N4 connecting a charging line Lc and a discharging line Ld is placed between the transistors Tpd and Tnd.

Because the resistors 50d and 52d of the second portion 20d act in the same manner as the resistors 50u and 52u of the first portion 20u, suppression of the through current in the first portion 20u is only explained, and the explanation for suppressing the through current in the second portion 20d is omitted.

A sum of resistance values of the resistors 50u and 52u is determined such that a current flowing from the drain of the transistor Tpu to the drain of the transistor Tnu is delayed almost by the delay time Δ1. Further, the resistance value of the resistor 50u is preferably determined while considering a charging speed of the positive charge supplied to the gate of the power element 16 through the transistor Tpu, and the resistance value of the resistor 52u is preferably determined while considering a discharging speed of the positive charge discharged from the gate of the power element 16 through the transistor Tnu. Therefore, the combination of the resistors 50u and 52u can make an adjustment of both the charging speed of the positive charge and the discharging speed of the positive charge, in addition to suppression of the through current.

Moreover, it is preferred that a speed of response of the power element 16 to the output pulse be heightened to perform the switching operation in the power element 16 as quickly as possible. However, when the switching operation is excessively quickened, noises caused by the switching operation are excessively generated in the power element 16. Further, because the power elements 16 and 18 are set in an on state together during an overlap period of time in the same manner as the transistors Tpu and Tnu, another through current easily flows through the power elements 16 and 18 during this overlap period of time. Therefore, it is preferred that resistance values of the resistors 50u, 52u, 50d and 52d be adjusted such that a speed of response of each element to the output pulse is heightened on condition that the excessive noises and the through current between the power elements 16 and 18 are sufficiently suppressed.

Therefore, because the resistors 50u, 52u, 50d and 52d suppress the through current flowing through the transistors Tpu and Tnu and the through current flowing through the transistors Tpd and Tnd, the driving circuit 20 can control the power elements 16 and 18 to perform the switching operation at an appropriate high frequency. Further, the driving circuit 20 can adjust the switching operation of the power elements 16 and 18 by appropriately setting resistance values of the resistors 50u, 52u, 50d and 52d.

Effects can be obtained in this driving circuit 20 as follows.

(1) The driving circuit 20 has the resistor 50u inserted in the charging line Lc so as to be connected with the transistor Tpu and the gate of the power element 16, the resistor 52u inserted in the discharging line Ld so as to be connected with the transistor Tnu and the node N3, the resistor 50d inserted in the charging line Lc so as to be connected with the transistor Tpd and the gate of the power element 18, and the resistor 52d inserted in the discharging line Ld so as to be connected with the transistor Tnd and the gate of the power element 18. Therefore, the driving circuit 20 can suppress both the through current flowing through the transistors Tpu and Tnu and the through current flowing through the transistors Tpd and Tnd. Accordingly, the driving circuit 20 can control the power elements 16 and 18 to perform the switching operation at high frequency. Further, because the driving circuit 20 can adjust the charging speed of the positive charges supplied to the gates of the power elements 16 and 18 and the discharging speed of the positive charges discharged from the gates of the power elements 16 and 18, a timing of the turn-on and turn-off of the power elements 16 and 18 can be adjusted.

(2) The driving circuit 20 has the transistors Tpu and Tnu having the gates connected with the second terminal of the coil 30bu, the sources connected with the first terminal of the coil 30bu, and the drains connected with the gate of the power element 16, as well as the transistors Tpd and Tnd having the gates connected with the second terminal of the coil 30bd, the sources connected with the first terminal of the coil 30bd, and the drains connected with the gate of the power element 18. Therefore, the driving circuit 20 has the transistors Tpu and Tnu alternately turned on and off in response to leading and trailing edges of the output pulse of the coil 30bu, as well as the transistors Tpd and Tnd alternately turned on and off in response to leading and trailing edges of the output pulse of the coil 30bd. Accordingly, the driving circuit 20 having a simplified configuration can drive the power elements 16 and 18 such that each of the power elements 16 and 18 performs a switching operation. Further, because the phase of the output pulse of the coil 30bd is set to be inverse to the phase of the output pulse of the coil 30bu, the driving circuit 20 can control the power elements 16 and 18 such that the power elements 16 and 18 are alternately turned on and off.

(3) The driving circuit 20 has the capacitor 32u and the capacitor 34u, in addition to the capacitor 32d and the capacitor 34d. The capacitor 32u is connected with the source of the transistor Tnu and the first terminal of the coil 30bu, and the capacitor 34u is connected with the source of the transistor Tpu and the first terminal of the coil 30bu. The capacitor 32d is connected with the source of the transistor Tnd and the first terminal of the coil 30bd, and the capacitor 34d is connected with the source of the transistor Tpd and the first terminal of the coil 30bd. Therefore, the capacitors 32u and 32d can respectively apply a negative voltage to the gates of the power elements 16 and 18, and the capacitors 34u and 34d can respectively apply a positive voltage to the gates of the power elements 16 and 18. Accordingly, the driving circuit 20 can drive the power elements 16 and 18 such that the power elements 16 and 18 stably perform the switching operation.

(4) The diodes 36u and 36d can respectively supply a negative charge to electrodes of the capacitors 32u and 32d facing the sources of the transistors Tnu and Tnd in response to each leading edge of the corresponding output pulse, while preventing the supplied negative charge from being discharged to the coils 30bu and 30bd in response to each trailing edge of the output pulse. Further, the diodes 38u and 38d can respectively supply a positive charge to electrodes of the capacitors 34u and 34d facing the sources of the transistors Tpu and Tpd in response to each trailing edge of the corresponding output pulse, while preventing the supplied positive charge from being discharged to the coils 30bu and 30bd in response to each leading edge of the output pulse. Accordingly, the positive charge can reliably be supplied from the capacitors 34u and 34d to the gates of the power elements 16 and 18 in response to each leading edge of the output pulses, and the supplied positive charge can reliably be discharged from the gates of the power elements 16 and 18 to the capacitors 32u and 32d.

(5) The driving circuit 20 has both the first portion 20u corresponding to the power element 16 and the second portion 20d corresponding to the power element 18. Accordingly, the driving circuit 20 can control the power elements 16 and 18 to be alternately turned on and off.

In this embodiment, the source of the transistor Tpu setting the charging line Lc at the conductive state acts as an input terminal and is connected with the first terminal of the coil 30bu, and the drain of the transistor Tpu acts as an output terminal and is connected with the gain of the power device 16. The drain of the transistor Tnu setting the discharging line Ld at the conductive state acts as an input terminal and is connected with the gain of the power device 16, and the source of the transistor Tnu acts as an output terminal and is connected with the first terminal of the coil 30bu.

Further, a positive electric charge is supplied to the gate of the power element 16 through the transistor Tpu in response to each leading edge of the first output pulse of the transformer 30 to set the power element 16 at an on state, and the supplied electric charge is discharged from the gate of the power element 16 through the transistor Tnu in response to each trailing edge of the first output pulse to set the power element 16 at an off state. However, our attention may be directed to a negative electric charge in place of the positive electric charge. That is, a negative electric charge is supplied to the gate of the power element 16 through the transistor Tnu in response to each trailing edge of the first output pulse to set the power element 16 at an off state, and the supplied electric charge is discharged from the gate of the power element 16 through the transistor Tpu in response to each leading edge of the first output pulse to set the power element 16 at an on state. In this case, a charging line extends between the capacitor 32u and the gate of the power element 16 through the transistor Tnu, and a discharging line extends between the capacitor 34u and the gate of the power element 16 through the transistor Tpu. The source of the transistor Tnu setting the charging line at the conductive state acts as an input terminal and is connected with the first terminal of the coil 30bu, and the drain of the transistor Tnu acts as an output terminal and is connected with the gain of the power device 16. The drain of the transistor Tpu setting the discharging line at the conductive state acts as an input terminal and is connected with the gain of the power device 16, and the source of the transistor Tpu acts as an output terminal and is connected with the first terminal of the coil 30bu.

In this embodiment, the transformer 30 is disposed in the driving circuit 20 to generate the output pulses. However, the output pulses may be directly given to the circuit portions 20u and 20d without using the transformer 30.

A current flowing between the source and drain in each of the power switching elements 16 and 18 is, for example, set at an effective value of tens A (amperes). A current flowing between the source and drain in each of the transistors Tpu and Tnu is, for example, set at an effective value of tens mA. However, this embodiment should not be construed as limiting to these current values.

Embodiment 2

As is well known, a MOS transistor has a parasitic diode. Therefore, when each of the transistors Tpu and Tpd shown in FIG. 1 is set at an off state, there is a probability that a small level of current leaks from the drain to the source through a parasitic diode in the transistor. In this case, even though resistance values of the resistors 50u, 50d, 52u and 52d are adjusted, it becomes difficult to independently set the charging and discharging speeds of the positive charges to/from the gates of the power elements 16 and 18. For example, when it is intended to heighten a charging speed of the positive charges supplied to the gates of the power elements 16 and 18, resistance values of the resistors 50u and 50d are set as small as possible. In this case, when a positive electric charge supplied to the gate of the power element 16 or 18 is discharged to the capacitor 32u or 32d, the charge also leaks through a parasitic diode of the transistor Tpu or Tnu. Therefore, a discharging speed of the charge discharged from the gate of the power element 16 or 18 is also heightened. As a result, a speed in the turn-off of the power elements 16 and 18 is excessively heightened, so that there is a high probability that switching noises generated in the power elements 16 and 18 are increased.

A driving circuit according to the second embodiment of the present invention is designed to prevent a current from leaking through a parasitic diode of each p-channel transistor.

Figure 5:
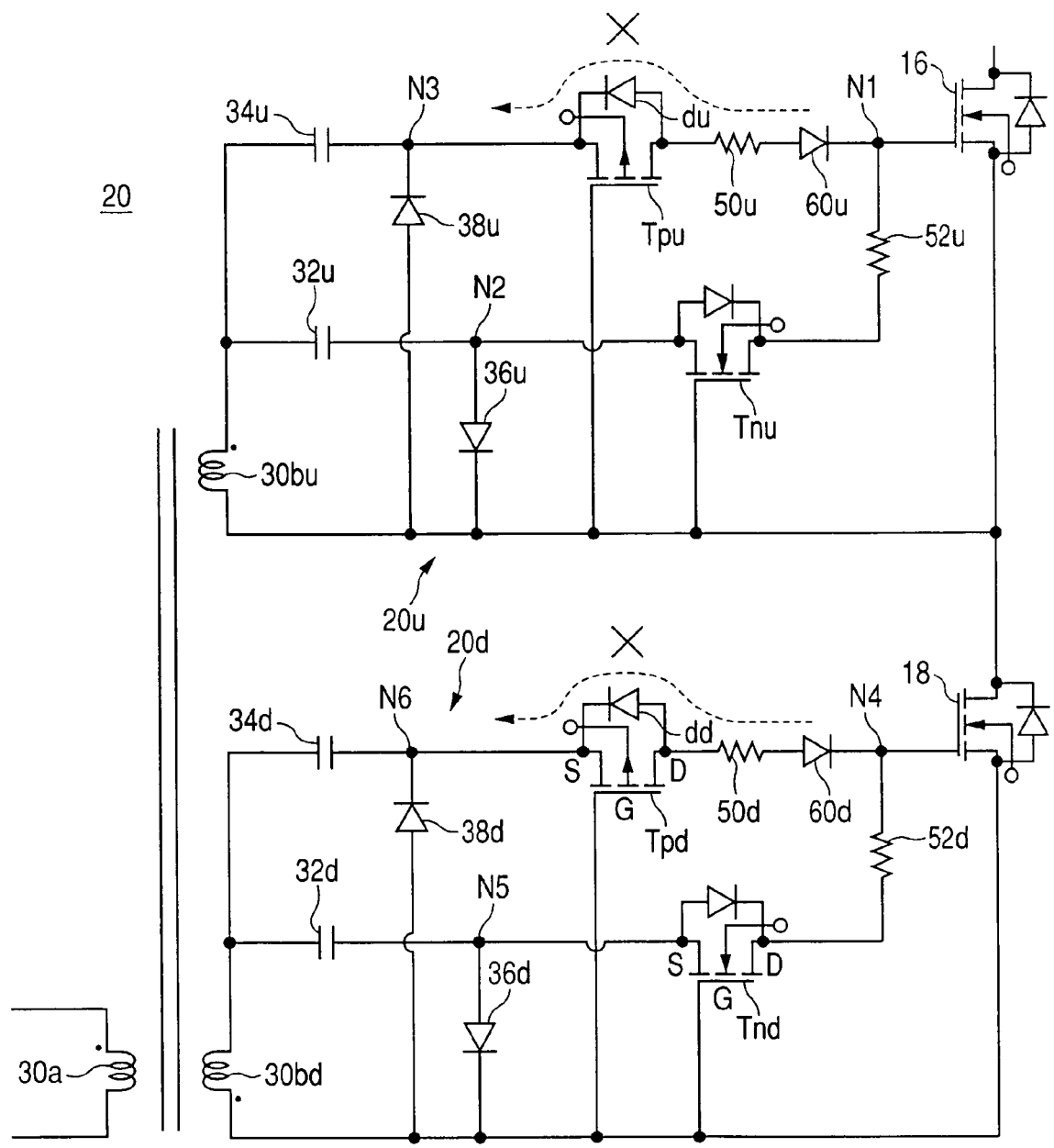
FIG. 5 is a circuit view showing a driving circuit for power switching elements according to a second embodiment of the present invention.

FIG. 5 is a circuit view showing a driving circuit for the power switching elements, 16 and 18 according to the second embodiment. As shown in FIG. 5, a driving circuit 20 according to the second embodiment differs from the driving circuit 20 shown in FIG. 1 in that rectifiers such as diodes 60u and 60d are additionally arranged in the circuit portions 20u and 20d, respectively. The diode 60u is inserted in the charging line Lc to be connected with the resistor 50u and the node N1 such that the diode 60u allows a current flowing from the resistor 50u to the node N1 and prevents a current from flowing along a direction from the node N1 to the resistor 50u. The diode 60d is connected with the resistor 50d and the node N4 such that the diode 60d allows a current flowing from the resistor 50d to the node N4 and prevents a current from flowing along a direction from the node N4 to the resistor 50d.

The diode 60u prevents a current from leaking from the gate of the power element 16 to the capacitor 34u through a parasitic diode du of the transistor Tpu, and the diode 60d prevents a leak current from flowing from the gate of the power element 18 to the capacitor 34d through a parasitic diode dd of the transistor Tpu.

Because the diodes 60u and 60d respectively prevent currents from leaking through the parasitic diodes du and dd, a timing of the turn-on of the power elements 16 and 18 determined by appropriately adjusting resistance values of the resistors 50u and 50d can be set independently from a timing of the turn-off of the power elements 16 and 18 determined by appropriately adjusting resistance values of the resistors 52u and 52d.

Further, because a timing of the turn-off of the power elements 16 and 18 is apt to be delayed as compared with a timing of the turn-on of the power elements 16 and 18, there is a probability that a through current flows through the power elements 16 and 18. To suppress this through current, it is preferable that resistance values R1u and R1d of the resistors 50u and 50d be respectively set to be larger than resistance values R2u and R2d of the resistors 52u and 52d (R1u>R2u, R1d>R2d). In this case, the resistance values R1u, R1d, R2u and R2d are set such that a speed of the turn-on and the turn-off is appropriately lowered so as to suppress the excessive generation of the switching noises in the power elements 16 and 18 while a through current flowing through the power elements 16 and 18 is appropriately suppressed to a level allowable in the switching control.

Accordingly, in addition to the effects (1) to (5) in the first embodiment, an effect can be obtained in the second embodiment as follows.

(6) Because the diodes 60u and 60d respectively prevent currents from leaking from the gates of the power elements 16 and 18 to the capacitors 34u and 34d through the parasitic diodes du and dd of the transistors Tpu and Tpd, a timing of the turn-on of the power elements 16 and 18 determined by the resistors 50u and 50d can be adjusted independently from a timing of the turn-off of the power elements 16 and 18 determined by the resistors 52u and 52d.

In this embodiment, to prevent a current from leaking from the gate of the power element 16 to the capacitor 34u through the parasitic diode du of the transistor Tpu, the diode 60u may be inserted in the charge line Lc so as to be connected with the capacitor 34u and the node N1. Similarly, the diode 60u may be inserted in the charge line Lc so as to be connected with the capacitor 34d and the node N4.

Embodiment 3

When it is desired to end the switching operation of the power elements 16 and 18, a control unit (not shown) controls the transformer 30 to stop supplying the output pulses to the circuit portions 20u and 20d. However, for example, when an output pulse to the circuit portion 20u is stopped after the output pulse is finally set at a high level, there is a probability that a positive charge remains at the gate of the power element 16 so as to maintain the power element 16 in an on state, and a positive charge remains at the first electrode of the capacitor 34d facing the transistor Tpd. In contrast, when an output pulse to the circuit portion 20u is stopped after the output pulse is finally set at a low level, there is a probability that a positive charge remains at the first electrode of the capacitor 34u facing the transistor Tpu, and a positive charge remains at the gate of the power element 18 so as to maintain the power element 18 in an on state. Therefore, after the switching operation of the power elements 16 and 18 is stopped, the DC-DC converter 10 undesirably continues outputting an output voltage due to a current flowing through the power element 16 or 18 set in the on state. Further, the positive charge remaining at the electrode of the capacitor 34u or 34d occasionally goes to the gate of the power element 16 or 18 through the transistor Tpu or Tpd slightly turned on. In this case, even though it is desired to end the switching operation of the power elements 16 and 18, there is a probability that the power elements 16 and 18 are set at an on state together. Therefore, a through current undesirably continues passing through the power elements 16 and 18, so that reliability of the power elements 16 and 18 is lowered.

A driving circuit according to the third embodiment of the present invention is designed to set the power elements 16 and 18 at an off state together when the switching operation of the power elements 16 and 18 is ended.

Figure 6:
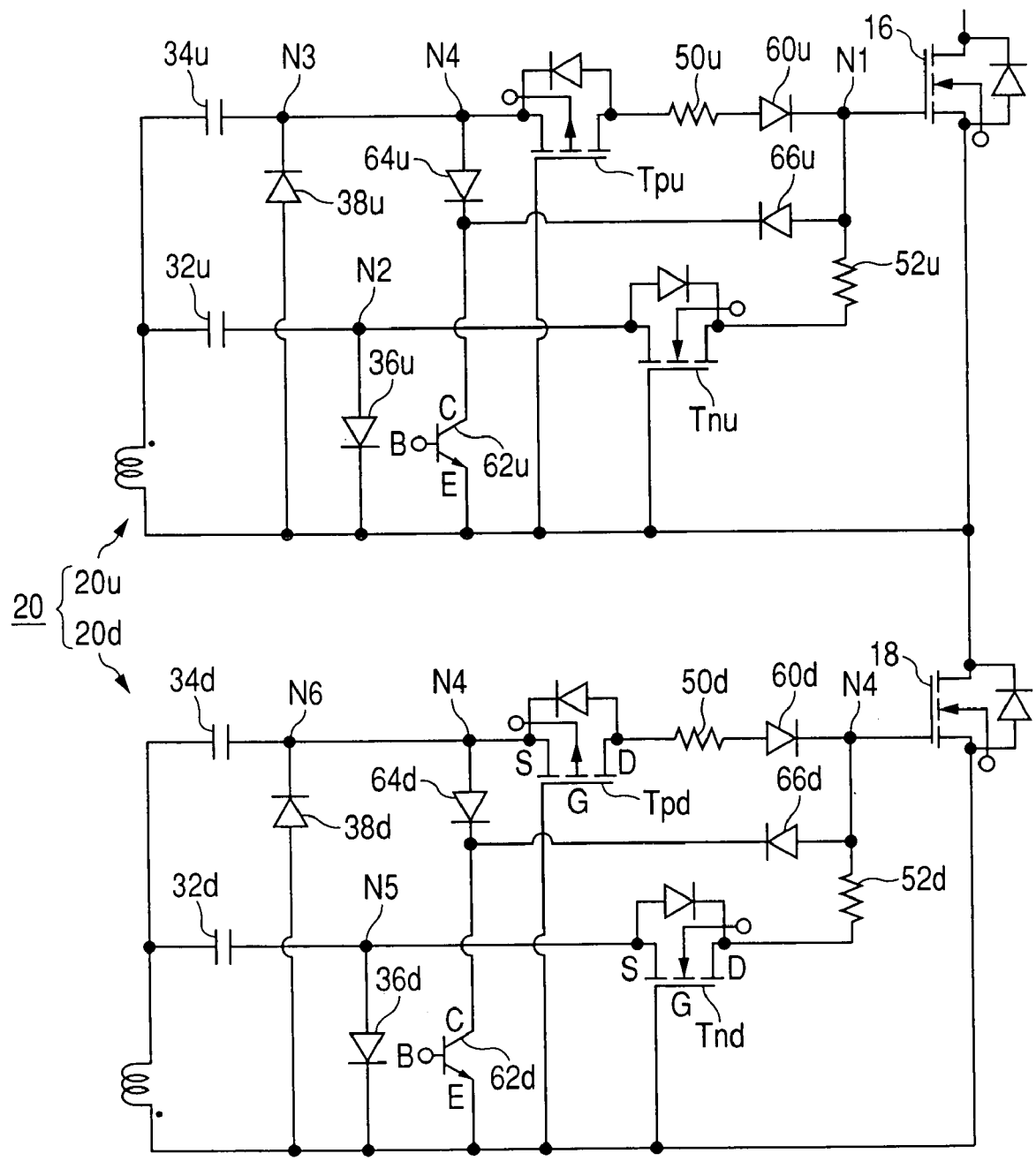
FIG. 6 is a circuit view showing a driving circuit for power switching elements according to a third embodiment of the present invention.

FIG. 6 is a circuit view showing a driving circuit according to the third embodiment. As shown in FIG. 6, a driving circuit 20 according to the third embodiment differs from the driving circuit 20 shown in FIG. 5 in that a discharging switch 62u, a diode 64u and a diode 66u are additionally arranged in the first portion 20u, and a discharging switch 62d, a diode 64d and a diode 66d are additionally arranged in the second portion 20d.

The switch 62u is disposed such that both the electrode of the capacitor 34u facing the source of the transistor Tpu and the gate of the power element 16 are connected with the second terminal of the coil 30bu through the switch 62u. The diode 64u is disposed so as to allow a current flowing from the capacitor 34u to the switch 62u and prevent a current from flowing along a direction from the switch 62u to the capacitor 34u. The diode 66u is disposed so as to allow a current flowing from the gate of the power element 16 to the switch 62u and prevent a positive current from flowing along a direction from the switch 62u to the gate of the power element 16.

The switch 62u is, for example, formed of a photo coupler and is controlled by a control unit (not shown) so as to be set at an on state when the switching operation of the power elements 16 and 18 is ended. The diodes 64d and 66d and the switch 62d are disposed in the second portion 20d, in the same manner as the diodes 64u and 66u and the switch 62u in the first portion 20u.

When the output pulses are respectively supplied to the circuit portions 20u and 20d, the diodes 64u and 66u prevent positive charges from being transferred between the capacitor 34u and the gate of the power element 16, and the diodes 64d and 66d prevent the positive charges from being transferred between the capacitor 34d and the gate of the power element 18.

When it is intended to end the switching operation of the power elements 16 and 18, the transformer 30 outputs no pulses, and the switches 62u and 62d are set at an on state together. Therefore, even when a positive charge is held at the capacitor 34u or the gate of the power element 16, the charge immediately passes through the diode 64u or 66u and the switch 62u and reaches the coil 30bu. Similarly, a positive charge held at the capacitor 34d or the gate of the power element 18 immediately passes through the diode 64d or 66d and the switch 62d and reaches the coil 30bd.

In addition to the effects (1) to (5) in the first embodiment and the effect (6) in the second embodiment, an effect can be obtained in the third embodiment as follows.

(7) When it is intended to end the switching operation of the power elements 16 and 18, a positive charge held at the capacitor 34u or the gate of the power element 16 can immediately be discharged to the transformer 30. Accordingly, the power elements 16 and 18 can reliably be set at the off state so as not to output a voltage from the converter 10. Further, when the output pulses are respectively supplied to the circuit portions 20u and 20d, the diodes 64u and 66u can prevent a positive charge from being transferred between the capacitor 34u and the gate of the power element 16, and the diodes 64d and 66d can prevent a positive charge from being transferred between the capacitor 34d and the gate of the power element 18.

In this embodiment, the diodes 60u and 60d are disposed in the circuit portions 20u and 20d. However, when a level of a leak current passing through a parasitic diode of each of the transistors Tpu and Tpd is negligible, each of the circuit portions 20u and 20d may have no diode between the drain of the transistor Tpu or Tpd and the gate of the power element 16 or 18.

Further, each of the switches 62u and 62d may be formed of a photo MOS relay, a switch using a transformer, or the like.

Embodiment 4

Figure 7:
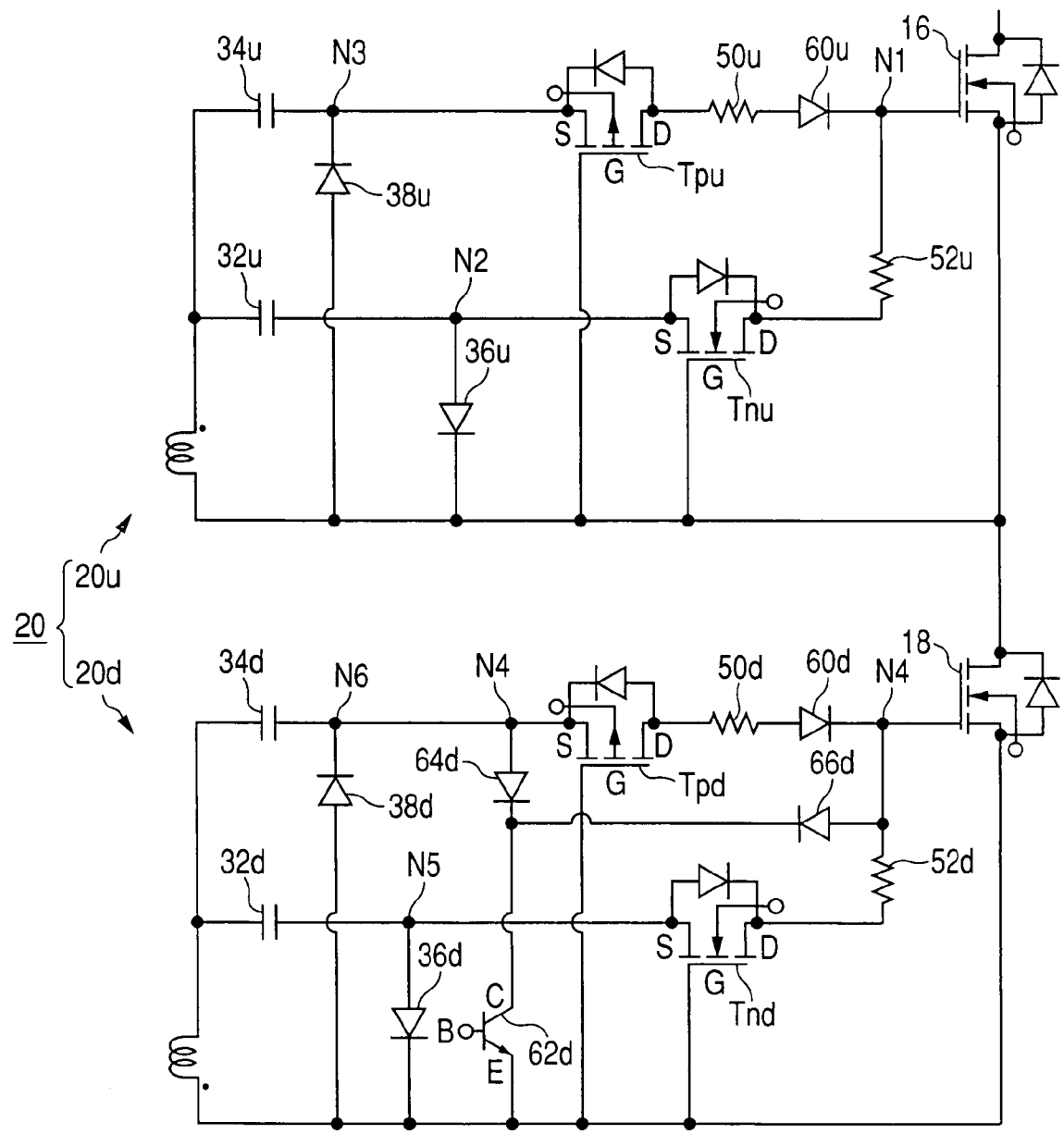
FIG. 7 is a circuit view showing a driving circuit for power switching elements according to a fourth embodiment of the present invention.

FIG. 7 is a circuit view showing a driving circuit according to the fourth embodiment of the present invention. As shown in FIG. 7, a driving circuit 20 according to the fourth embodiment differs from the driving circuit 20 shown in FIG. 5 in that the diode 64d, the diode 66d and the discharging switch 62d are additionally arranged in the second portion 20d.

With this arrangement of the second portion 20d, when the transformer 30 outputs no pulses to end the switching operation of the power elements 16 and 18, the power element 18 is reliably set at an off state in the same manner as in the third embodiment. In contrast, when a positive charge remains at the capacitor 34u or the gate of the power element 16, the power element 16 is occasionally set at an on state. However, because the power element 18 is reliably set at the off state, no through current passes through the power elements 16 and 18, but charges held in the capacitor 44 shown in FIG. 1 are merely discharged.

Accordingly, in addition to the effects (1) to (6) in the first and second embodiments, an effect can be obtained in the fourth embodiment as follows.

(8) When the transformer 30 outputs no pulses to end the switching operation of the power elements 16 and 18, the switch 62*d* can reliably prevent a through current from passing through the power elements 16 and 18. Further, the number of parts required in the driving circuit 20 can be reduced, as compared with in the third embodiment.

Modifications

In the first to third embodiments, the driving circuit 20 drives and controls two power switching elements 16 and 18. However, the driving circuit 20 may drive and control only a single power switching element. In this case, in the DC-DC converter 10, an alternating current is generated based on a switching operation of the single power switching element, and an output voltage induced in the transformer 14 based on the alternating current is output.

In the first to forth embodiments, the resistor 50*u* may be connected with the node N3 and the source of the transistor Tpu, and the resistor 52*u* may be connected with the node N2 and the source of the transistor Tnu. In the same manner, the resistor 52*d* may be connected with the source of the transistor Tnu and a fifth node N5 between the capacitor 32*d* and the source of the transistor Tnd, and the resistor 50*d* may be connected with the source of the transistor Tpd and a sixth node N6 between the capacitor 34*d* and the source of the transistor Tpd.

Further, to reduce a difference between a timing of the turn-on of the transistor Tpu and a timing of the turn-off of the transistor Tnu or a difference between a timing of the turn-off of the transistor Tpu and a timing of the turn-on of the transistor Tnu, only the resistor 50*u* may be disposed in the circuit portion 20*u* without disposing the resistor 52*u*, or only the resistor 52*u* may be disposed in the circuit portion 20*u* without disposing the resistor 50*u*. Similarly, to reduce a difference between a timing of the turn-on of the transistor Tnd and a timing of the turn-off of the transistor Tnd or a difference between a timing of the turn-off of the transistor Tpd and a timing of the turn-on of the transistor Tnd, only the resistor 50*d* may be disposed in the circuit portion 20*d* without disposing the resistor 52*d*, or only the resistor 52*d* may be disposed in the circuit portion 20*d* without disposing the resistor 50*d*. For example, the resistors 52*u* and 52*d* may be omitted from the driving circuit 20 to turn off the power elements 16 and 18 as soon as possible. In this case, resistance values of the resistors 50*u* and 50*d* may respectively be set so as to compensate the delay time Δ1 of the turn-off of the transistors Tnu and Tnd with respect to the turn-on of the transistors Tpu and Tpd, while the driving circuit 20 suppresses a through current flowing through the transistors Tpu and Tnu and a through current flowing through the transistors Tpd and Tnd at an appropriate level so as to control the power elements 16 and 18 at a desired switching frequency.

Moreover, at least one of the power switching elements 16 and 18 may be formed of a p-channel MOS power transistor. In this case, when a negative electric charge is supplied to the gate of the p-channel power transistor 16 or 18 through the transistor Tnu or Tnd in response to each trailing edge of the output pulse, the p-channel power transistor 16 or 18 is set at an on state. In contrast, when the supplied negative electric charge is discharged to the capacitor 34*u* or 34*d* through the transistor Tpu or Tpd in response to each leading edge of the output pulse, the p-channel power transistor 16 or 18 is set at an off state. Therefore, when the power switching elements 16 and 18 are respectively formed of a p-channel MOS power transistor and an n-channel MOS power transistor, the output pulses of the transformer 30 are set to have the same phase as each other.

Figure 8:
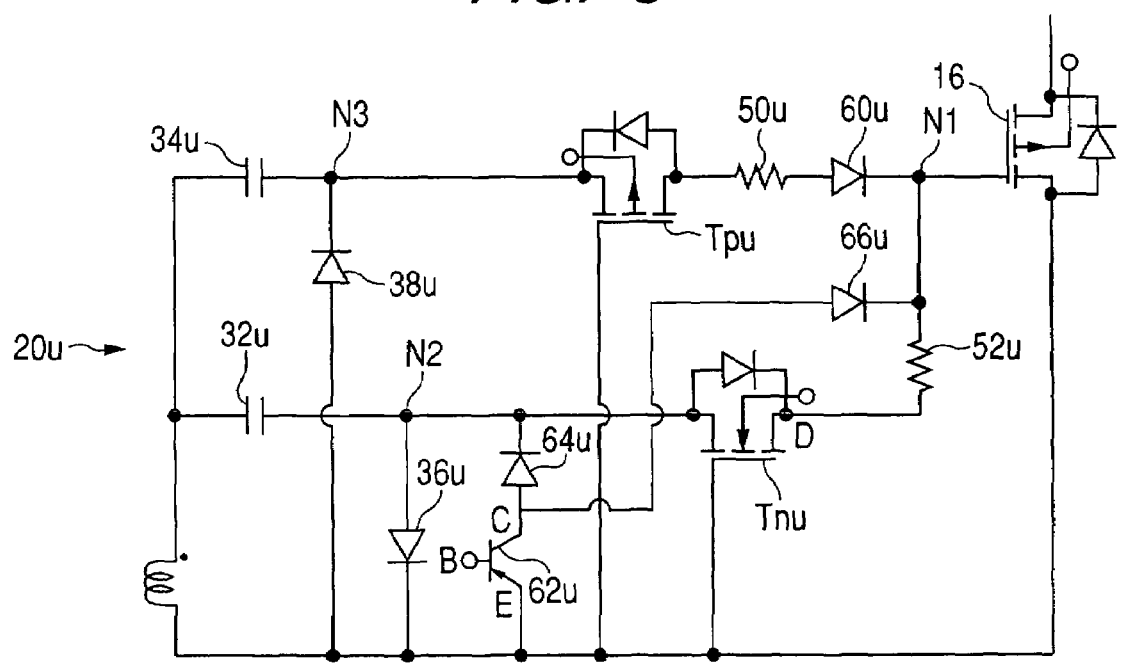
FIG. 8 is a circuit view showing a driving circuit for power switching elements according to a modification of the fourth embodiment of the present invention.

When a p-channel MOS power transistor is, for example, used as the power element 16 according to a modification of the third embodiment, as shown in FIG. 8, diodes 64*u* and 66*u* and a discharging switch 62*u* formed of an p-n-p transistor are disposed in the circuit portion 20*u*. More specifically, a collector of the switch 62*u* is electrically connected with the capacitor 32*u* or the gate of the power element 16, and an emitter of the switch 62*u* is electrically connected with the second terminal of the secondary coil 30*bu*. The diode 64*u* is connected with the capacitor 32*u* and the discharging switch 62*u* such that the diode 64*u* allows a current flowing from the discharging switch 62*u* to the capacitor 32*u* and prevents a current from flowing along a direction from the capacitor 32*u* to the discharging switch 62*u*. The diode 66*u* is connected with the gate of the power element 16 and the discharging switch 62*u* such that the diode 66*u* allows a current flowing from the discharging switch 62*u* to the gate of the power element 16 and prevents a current from flowing along a direction from the gate of the power element 16 to the discharging switch 62*u*. When the switch 62*u* is set at an on state, a negative electric charge held at the capacitor 32*u* or the gate of the power element 16 is discharged to the second terminal of the secondary coil 30*bu*.

Furthermore, each of the power elements 16 and 18 is not limited to an MOS transistor, but may be any power switching element wherein an on state and an off state are alternately set in response to a change of a voltage applied to a conducting control terminal of the power element. For example, the power element may be formed of an insulated-gate bipolar transistor (IGBT) or the like.

Still further, the resistors 50*u* and 52*u* are disposed in the driving circuit 20 to prevent that both the transistors Tpu and Tnu are set in an on state together. The driving circuit 20 is capable of being tuned so as to drive the power element 16 at an appropriate switching frequency at which the transistors Tpu and Tnu are substantially turned on and off at the same time. However, even though the driving circuit 20 is tuned in advance so as to prevent that both the transistors Tpu and Tnu are set in an on state together, the transistors Tpu and Tnu become set in an on state together due to a change in an ambient temperature or a change in characteristics of the driving circuit 20 based on a long use of the driving circuit 20. Therefore, the resistors 50*u* and 52*u* are effective in the driving circuit 20 even when the driving circuit 20 is tuned. Similarly, the resistors 50*d* and 52*d* are effective in the driving circuit 20.

Still further, the present invention should not be construed as limiting to the power elements 16 and 18 which are connected with the primary coils 14*a* of the DC-DC converter 10. For example, the power elements 16 and 18 may be parts of an inverter which supplies a three-phase alternating current power to an electric motor.

Still further, the present invention should not be construed as limiting to the driving circuit 20 mounted on a hybrid vehicle. For example, the driving circuit 20 may be mounted on an electric vehicle.

What is claimed is:

1. A driving circuit, which drives a power switching element while alternately setting the power switching element at an on state and an off state by applying a voltage to a conducting control terminal of the power switching element in response to an output pulse, comprising:

a first switching element which sets a charging line at a conductive state in response to a first edge of the output pulse to supply an electric charge to the conducting control terminal of the power switching element through the first switching element and the charging line and to set the power switching element at one of the on and off states;

a second switching element which sets a discharging line at a conductive state in response to a second edge of the output pulse to discharge the supplied electric charge from the conducting control terminal of the power switching element through the second switching element and the discharging line and to set the power switching element at the other state; and a current suppressing element which suppresses a through current flowing, in response to at least one of the first and second edges of the output pulse, through the first switching element and the second switching element.

2. The driving circuit according to claim 1, wherein the current suppressing element is formed of a resistive element which is inserted in the charging line or the discharging line.

3. The driving circuit according to claim 2, wherein the charging and discharging lines are connected with each other at a connecting node placed between the conducting control terminal of the power switching element and the first switching element, and the resistive element is connected with the first switching element and the connecting node on the charging line or is connected with the second switching element and the connecting node on the discharging line.

4. The driving circuit according to claim 1, further comprising a transformer, having a primary coil and a secondary coil, which generates the output pulse in the secondary coil in response to an input pulse supplied to the primary coil, wherein one of the first and second switching elements is formed of a p-channel transistor, the other one of the first and second switching elements is formed of an n-channel transistor, an input terminal of the transistor setting the charging line at the conductive state is connected with a first terminal of the secondary coil of the transformer, an output terminal of the transistor setting the charging line at the conductive state is connected with the conducting control terminal of the power switching element, an input terminal of the transistor setting the discharging line at the conductive state is connected with the conducting control terminal of the power switching element, an output terminal of the transistor setting the discharging line at the conductive state is connected with the first terminal of the secondary coil of the transformer, and a gate of the p-channel transistor and a gate of the n-channel transistor are connected with a second terminal of the secondary coil of the transformer.

5. The driving circuit according to claim 3, further comprising a rectifier inserted in the charging line such that the rectifier allows a current flowing from the drain of the p-channel transistor to the conducting control terminal of the power switching element and prevents a current from flowing from the conducting control terminal of the power switching element to the drain of the p-channel transistor.

6. The driving circuit according to claim 1, further comprising a transformer having a primary coil and a secondary coil which generates the output pulse in the secondary coil in response to an input pulse supplied to the primary coil;

a first capacitor, connected with a first terminal of the secondary coil and the first switching element, which receives the electric charge from the transformer in response to a third edge of the output pulse preceding the first edge of the output pulse and outputs the received electric charge to the conducting control terminal of the power switching element through the first switching element in response to the first edge of the output pulse; and a second capacitor, connected with the first terminal of the secondary coil and the second switching element, which receives the electric charge from the conducting control terminal of the power switching element through the second switching element in response to the second edge of the output pulse and outputs the received electric charge to the transformer through a second terminal of the secondary coil in response to a fourth edge of the output pulse succeeding the second edge of the output pulse.

7. The driving circuit according to claim 6, further comprising a first rectifier connected with the second terminal of the secondary coil and a first node between the first capacitor and the first switching element such that the first rectifier allows a current flowing from the second terminal of the secondary coil to the first node and prevents a current from flowing from the first node to the second terminal of the secondary coil, and a second rectifier connected with the second terminal of the secondary coil and a second node between the second capacitor and the second switching element such that the second rectifier allows a current flowing from the second node to the second terminal of the secondary coil and prevents a current from flowing from the second terminal of the secondary coil to the second node.

8. The driving circuit according to claim 6, further comprising a discharging switch connected with the first capacitor and the second terminal of the secondary coil; and a rectifier connected with the first capacitor and the discharging switch such that the rectifier allows a current flowing from the first capacitor to the discharging switch and prevents a current from flowing from the discharging switch to the first capacitor, wherein the power switching element is set at the on state when a positive electric charge of the first capacitor is supplied to the conducting control terminal of the power switching element as the electric charge, and the supplied positive electric charge is discharged to the transformer through the rectifier and the discharging switch when the discharging switch is set at an on state.

9. The driving circuit according to claim 6, further comprising a discharging switch connected with the first capacitor and the second terminal of the secondary coil; and a rectifier connected with the first capacitor and the discharging switch such that the rectifier allows a current flowing from the discharging switch to the first capacitor and prevents a current from flowing from the first capacitor to the discharging switch, wherein the power switching element is set at the on state when a negative electric charge of the first capacitor is supplied to the conducting control terminal of the power switching element as the electric charge, and the supplied negative electric charge is discharged to the transformer through the rectifier and the discharging switch when the discharging switch is set at an on state.

10. The driving circuit according to claim 1, further comprising a discharging switch connected with the conducting control terminal of the power switching element and the second terminal of the secondary coil; and a rectifier connected with the conducting control terminal of the power switching element and the discharging switch such that the rectifier allows a current flowing from the conducting control terminal of the power switching element to the discharging switch and prevents a current from flowing from the discharging switch to the conducting control terminal of the power switching element, wherein the power switching element is set at the on state when a positive electric charge of the first capacitor is supplied to the conducting control terminal of the power switching element as the electric charge, and the supplied positive electric charge is discharged to the transformer through the rectifier and the discharging switch when the discharging switch is set at an on state.

11. The driving circuit according to claim 1, further comprising a discharging switch connected with the conducting control terminal of the power switching element and the second terminal of the secondary coil; and a rectifier connected with the conducting control terminal of the power switching element and the discharging switch such that the rectifier allows a current flowing from the discharging switch to the conducting control terminal of the power switching element and prevents a current from flowing from the conducting control terminal of the power switching element to the discharging switch, wherein the power switching element is set at the on state when a negative electric charge of the first capacitor is supplied to the conducting control terminal of the power switching element as the electric charge, and the supplied negative electric charge is discharged to the transformer through the rectifier and the discharging switch when the discharging switch is set at an on state.

12. The driving circuit according to claim 1, further comprising a transformer which generates both a first output pulse given to the first and second switching elements and a second output pulse of which a phase is inverse to the first output pulse, a third switching element which sets a second charging line at a conductive state in response to a first edge of the second output pulse of the transformer to supply an electric charge to a conducting control terminal of a second power switching element through the third switching element and the second charging line and to set the second power switching element at one of on and off states;

a fourth switching element which sets a second discharging line at a conductive state in response to a second edge of the second output pulse of the transformer succeeding the first edge to discharge the supplied electric charge from the conducting control terminal of the second power switching element through the fourth switching element and the second discharging line and to set the second power switching element at the other state; and a second current suppressing element which suppresses a through current flowing, in response to at least one of the first and second edges of the second output pulse, through the third switching element and the fourth switching element, wherein the second power switching element is serially connected with the power switching element, the second power switching element is alternately set at the on state and the off state in response to the second output pulse, and the power switching element and the second power switching element are alternately set at the on state.

13. The driving circuit according to claim 12, further comprising a capacitor, connected with a first terminal of a secondary coil of the transformer and the first switching element, which receives a positive electric charge from the transformer in response to a third edge of the output pulse preceding the first edge of the output pulse and outputs the received positive electric charge to the conducting control terminal of the power switching element through the first switching element in response to the first edge of the output pulse;

a discharging switch through which the capacitor, the conducting control terminal of the power switching element and a second terminal of the secondary coil of the transformer are connected with one another;

a first rectifier connected with the capacitor and the discharging switch such that the rectifier allows a current flowing from the capacitor to the discharging switch and prevents a current from flowing from the discharging switch to the capacitor; and a second rectifier connected with the conducting control terminal of the power switching element and the discharging switch such that the rectifier allows a current flowing from the conducting control terminal of the power switching element to the discharging switch and prevents a current from flowing from the discharging switch to the conducting control terminal of the power switching element, wherein the power switching element is set at the on state when the positive electric charge of the capacitor is supplied to the conducting control terminal of the power switching element, the supplied positive electric charge is discharged to the transformer through the second rectifier and the discharging switch when the discharging switch is set at an on state, and the positive electric charge of the capacitor is discharged to the transformer through the first rectifier and the discharging switch when the discharging switch is set at the on state before the first edge of the output pulse.

14. The driving circuit according to claim 12, further comprising a capacitor, connected with a first terminal of a secondary coil of the transformer and the first switching element, which receives a negative electric charge from the transformer in response to a third edge of the output pulse preceding the first edge of the output pulse and outputs the received negative electric charge to the conducting control terminal of the power switching element through the first switching element in response to the first edge of the output pulse;

a discharging switch through which the capacitor, the conducting control terminal of the power switching element and a second terminal of the secondary coil of the transformer are connected with one another;

a first rectifier connected with the capacitor and the discharging switch such that the rectifier allows a current flowing from the discharging switch to the capacitor and prevents a current from flowing from the capacitor to the discharging switch; and a second rectifier connected with the conducting control terminal of the power switching element and the discharging switch such that the rectifier allows a current flowing from the discharging switch to the conducting control terminal of the power switching element and prevents a current from flowing from the conducting control terminal of the power switching element to the discharging switch, wherein the power switching element is set at the on state when the negative electric charge of the capacitor is supplied to the conducting control terminal of the power switching element, the supplied negative electric charge is discharged to the transformer through the second rectifier and the discharging switch when the discharging switch is set at an on state, and the negative electric charge of the capacitor is discharged to the transformer through the first rectifier and the discharging switch when the discharging switch is set at the on state before the first edge of the output pulse.

15. The driving circuit according to claim 1, wherein the first switching element is adapted to set the charging line at a non-conductive state in response to the second edge of the output pulse to prevent the electric charge from being supplied to the conducting control terminal of the power switching element, the second switching element is adapted to set the discharging line at a non-conductive state in response to the first edge of the output pulse to prevent the electric charge from being discharged from the conducting control terminal of the power switching element, the charging and discharging lines are connected with each other at a connecting node, and the through current flows through the connecting node and the first and second switching elements when the setting of the non-conductive state of the charging line by the first switching element is delayed from the setting of the conductive state of the discharging line by the second switching element or the setting of the non-conductive state of the discharging line by the second switching element is delayed from the setting of the conductive state of the charging line by the first switching element.

* * * * *

UNITED STATES PATENT AND TRADEMARK OFFICE
CERTIFICATE OF CORRECTION

| | |
|---|---|
| PATENT NO. | : 7,405,953 B2 |
| APPLICATION NO. | : 11/708672 |
| DATED | : July 29, 2008 |
| INVENTOR(S) | : Nakamura et al. |

It is certified that error appears in the above-identified patent and that said Letters Patent is hereby corrected as shown below:

On the title page, under (73) Assignee, include the second assignee as follows:

Nippon Soken, Inc.,
Nishio-city, Aichi-pref. (JP)

Signed and Sealed this

Twenty-third Day of December, 2008

JON W. DUDAS
*Director of the United States Patent and Trademark Office*

UNITED STATES PATENT AND TRADEMARK OFFICE
CERTIFICATE OF CORRECTION

PATENT NO.        : 7,405,953 B2
APPLICATION NO.   : 11/708672
DATED             : July 29, 2008
INVENTOR(S)       : Nakamura et al.

It is certified that error appears in the above-identified patent and that said Letters Patent is hereby corrected as shown below:

On the title page, under (73) Assignee, include the second assignee as follows:

**Nippon Soken, Inc.,
Nishio-city, Aichi-pref. (JP)**

Signed and Sealed this

Sixth Day of January, 2009

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,405,953 B2 | Page 1 of 1 |
| APPLICATION NO. | : 11/708672 | |
| DATED | : July 29, 2008 | |
| INVENTOR(S) | : Kimikazu Nakamura et al. | |

It is certified that error appears in the above-identified patent and that said Letters Patent is hereby corrected as shown below:

This certificate vacates the Certificate of Correction issued January 6, 2009. The certificate is a duplicate of the Certificate of Correction issued December 23, 2008. All requested changes were included in the Certificate of Correction issued December 23, 2008.

Signed and Sealed this

Third Day of February, 2009

JOHN DOLL
*Acting Director of the United States Patent and Trademark Office*

UNITED STATES PATENT AND TRADEMARK OFFICE
CERTIFICATE OF CORRECTION

PATENT NO. : 7,405,953 B2
APPLICATION NO. : 11/708672
DATED : July 29, 2008
INVENTOR(S) : Nakamura et al.

It is certified that error appears in the above-identified patent and that said Letters Patent is hereby corrected as shown below:

On the title page, insert (73) Assignee, as follows:

--Denso Corporation,
Kariya-city, Aichi-pref. (JP)
Nippon Soken, Inc.,
Nishio-city, Aichi-pref. (JP)--

This certificate supersedes the Certificate of Correction issued December 23, 2009.

Signed and Sealed this

Fourteenth Day of April, 2009

JOHN DOLL
*Acting Director of the United States Patent and Trademark Office*